United States Patent [19]

Laumann

[11] Patent Number: 5,136,514
[45] Date of Patent: Aug. 4, 1992

[54] TARIFF ARRANGEMENT WITH SECURE BIDIRECTIONAL INTERFACE

[75] Inventor: Horst Laumann, Zug, Switzerland

[73] Assignee: Landis & Gyr Betriebs AG, Zug, Switzerland

[21] Appl. No.: 595,293

[22] Filed: Oct. 10, 1990

[30] Foreign Application Priority Data

Dec. 15, 1989 [CH] Switzerland ............... 4514/89

[51] Int. Cl.⁵ .............................................. G07B 15/00
[52] U.S. Cl. ............................ 364/464.04; 364/467; 395/425
[58] Field of Search ............... 235/29 R, 29 A, 30 R, 235/30 A, 33; 364/200, 464.04, 467, 900; 395/425, 725

[56] References Cited

U.S. PATENT DOCUMENTS

| | | | |
|---|---|---|---|
| 4,240,146 | 12/1980 | Iles | 364/467 |
| 4,442,492 | 4/1984 | Karlsson et al. | 364/464.04 |
| 4,539,644 | 9/1985 | Adams et al. | 364/467 |
| 4,580,039 | 4/1986 | Adams | 235/30 R |
| 4,809,185 | 2/1989 | Talmadge | 364/464.02 |
| 4,998,203 | 3/1991 | Di Giulio et al. | 371/62 X |

FOREIGN PATENT DOCUMENTS 3203263  8/1983  Fed. Rep. of Germany .
2520915  8/1983  France .
2183852  6/1987  United Kingdom .

OTHER PUBLICATIONS

A. Horlent et al., "A New Generation of Electronic Devices For Maximum Demand and Multi-rate Tariffs, With Manual or Automatic Local Read-out", Fifth International Conference on Metering Apparatus and Tariffs for Electrical Supply.

Primary Examiner—Parshotam S. Lall
Assistant Examiner—Edward R. Cosimano
Attorney, Agent, or Firm—Marmorek, Guttman & Rubenstein

[57] ABSTRACT

A tariff arrangement which is preferably intended for an electricity meter comprises a microprocessor, a data memory and a bidirectional interface for transfer of data with a read-out device. For the duration of a data transfer operation a timing member is activated and by way of a logic circuit inhibits a predetermined memory region to prevent data from being written thereto. The data which are stored in the memory region, for charging purposes, are therefore protected from unintentional alterations during the data transfer operation, even if the software should have corresponding defects. The function of the timing member and the logic circuit can be checked in a simple manner.

5 Claims, 1 Drawing Sheet

TARIFF ARRANGEMENT WITH SECURE BIDIRECTIONAL INTERFACE

BACKGROUND OF THE INVENTION

1. Field of the Invention

This invention relates to a tariff arrangement, preferably but not exclusively for an electricity meter, comprising a microcomputer, a data memory and an interface for the bidirectional transfer of data from and to an external terminal.

2. Description of the Prior Art

A tariff arrangement of the above-mentioned kind is known from Protocol 1987 of the Fifth International Conference on Metering Apparatus and Tariffs for Electricity Supply (JSBN 0 85296346 7 ISSN 0537—9980) pages 86 to 90. In that tariff arrangement, data stored in the data memory can be transferred into a mobile read-out device by way of an optical bidirectional data link to an interface and conversely data can be transferred into the tariff arrangement from the read-out device. In a read-out operation for example the clock time and the calendar are set to the newest state, but it is also possible to alter parameters which serve for tariff configuration. The data link is standarized (DN 66258).

If electricity meters and associated tariff arrangements are covered by the requirement for calibration, those measuring assemblies are sealed after the calibration operation by means of lead seals, thereby ensuring that data which are relevant from the point of view of calibration law can only be altered after the lead seal has been broken. In the case of the above-mentioned tariff arrangement however it is also possible for softward parameters to be varied by way of the optical bidirectional interface. There are objections to allowing such tariff arrangements for calibration because it is not impossible that, in the event of unrecognised errors in the software, data serving for charging purposes could also be varied by way of the interface.

SUMMARY OF THE INVENTION

It is an object of the present invention to provide a tariff arrangement with a bidirectional interface, which is simple to check and which is calibratable.

In accordance with the present invention, the tariff arrangement is provided with an inhibiting circuit which during the data transfer operation inhibits a predetermined memory region of the data memory to prevent the writing in of data to that region. Accordingly, it is possible that data which serve for the charging of consumed energy or power may be stored in the predetermined memory region.

Preferably, the arrangement includes a timer for inhibiting the input of data into the predetermined memory region, which timer is activatable for the duration of the data transfer. In this case, the timer and a control line which enables the data memory for data to be written into same may be linked to a logic circuit in such a way that during the data transfer operation the predetermined memory region is inhibited to prevent data from being written thereto. Alternatively, the timer, a control line which enables the data memory for the writing in of data, a number of address lines corresponding to the predetermined memory region and logic circuits may be linked together in such a way that during the data transfer the predetermined memory region in inhibited to prevent data from being written thereto.

Preferably, the inhibiting circuit is so designed that the function thereof can be checked.

Further objects, features and advantages of the present invention will be apparent from the following description, giving by way of non-limiting example, of preferred embodiments of the present invention.

DESCRIPTION OF THE PREFERRED EMBODIMENTS

Figure 1:
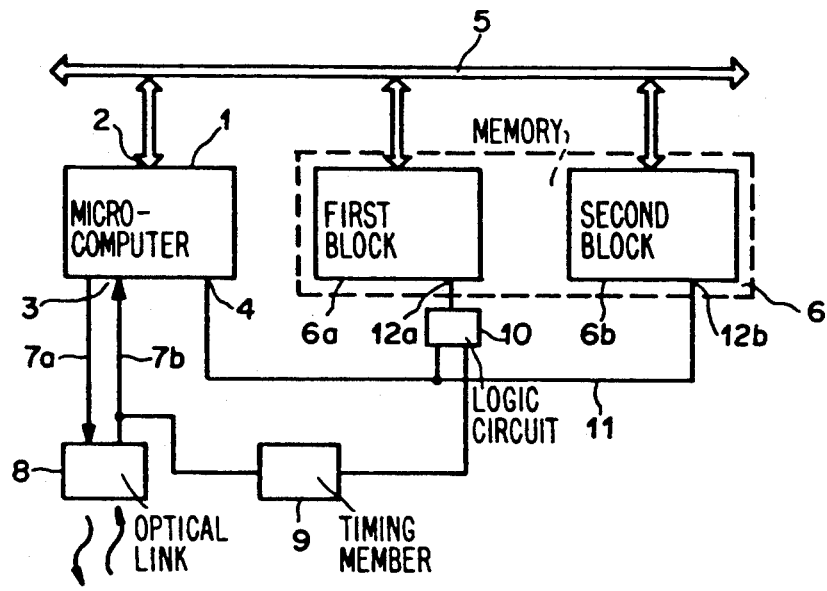
FIG. 1 shows a part of a block circuit diagram of a tariff arrangement.

Referring to FIG. 1, shown therein is a microcomputer 1 with a parallel data port 2, a serial data port 3 and a control output 4 for signals "read memory" and "write to memory" respectively. The parallel data port 2 is connected by way of a data bus 5 to a data memory 6. The data memory 6 is made up of two memory blocks 6a and 6b which are both in the form of random access memories. The memory block 6a stores measurement values and parameters which are important for the purposes of charging for the consumed energy of power. The memory block 6b stores parameters of subordinate significance such as for example clock time, data etc. A program memory for storage of the operating program of the tariff arrangement is integrated in the microcomputer 1. The serial data port 3 is connected by way of two lines 7a and 7b to a bidirectional optical interface 8. The interface 8 serves for data transfer in relation to a read-out device (not shown there). The line 7a transfers the data from the microcomputer 1 to the optical interface 8 and the line 7b transfers the data in the opposite direction. The line 7b is additionally connected to an input timer 9. An output of the timer 9 is connected to a first input of a logic circuit 10. The control output 4 of the microcomputer 1 is connected by way of a control line 11 to a second input of the logic circuit 10 and to a control input. 12b of the memory block 6b. The output of the logic circuit 10 is connected to a control input 12a of the memory block 6a.

The microcomputer 1 receives incremental pulses from an electricity meter (not shown here). Those pulses are linked to parameters which are stored in the memory block 6a and summed in the memory block 6a as energy and power values. The energy and power values can be displayed on a display unit (not shown). For charging purposes those data are transferred into the read-out device by way of the optical interface 8 and transmitted from the read-out device to a data processing installation for billing purposes.

A data transfer by way of the optical interface 8 is instituted by a request telegram from the read-out device to the microcomputer 1. The request telegram causes the microcomputer 1 to fetch data at which are stored in the data memory 6 by way of the data bus 5 and the parallel data port 2, to convert them into a serial data stream and to pass them by way of the serial data port 3 and the line 7a to the optical interface 8. Conversely data can be transferred from the read-out device to the optical interface 8 and from there by way of the line 7b to the serial data port 3 of the microcomputer 1. The microcomputer 1 converts the serial data into parallel data and transmits it by way of the parallel data port 2 to the data memory 6. Data can be read out of or written into the data memory 6 if the appropriate address occurs at the data memory 6 and the control input 12a or 12b carries the signal "read memory " or "write to memory ", for example logic "1" for "read" and logic "0" for "write".

In the normal operating condition of the tariff arrangement, that is to say when no reading-out operation is occurring, the line 7b is in a stable state of for example logic "1". At the beginning of the request telegram, the line 7b changes its state from "1" to "0". Due to the change in state of the line 7b, the timer 9 is impulsed and activated for the duration of a data transfer operation. Its output switches from a state of for example "1" into a state "0". The logic circuit 10 connects the timer 9 and the control line 11 in such a way that the memory block 9a is inhibited from being written into, during the data transfer operation. Therefore during a data transfer operation the memory block 6a can only be read with the read-out device while the memory block 6a can be both read and also written into.

Pulses which are received from the electricity meter during a reading-out operation must be put into intermediate storage. They can be written into the memory block 6a only after the reading-out operation is terminated. The pulses may be put into intermediate storage for example in a random accessed memory which is integrated in the microcomputer 1.

Therefore, during a data transfer operation using the read-out device, a predetermined memory region, namely the memory block 6a, of the data memory 6 is inhibited to prevent data from being written into same. The data stored in the memory block 6a are therefore reliably protected from alteration.

The inhibiting circuit comprising the timer 9, the logic circuit 10 and the control line 11 and which inhibits the memory block 6a to prevent data from being written into same during the data transfer operation is advantageously of such a configuration that is arranged in an accessible and clearly visible fashion, that the function thereof can be checked in a simple manner when effecting calibration of the tariff arrangement. That is different from software in regard to which functional testing is highly expensive.

Figure 2:
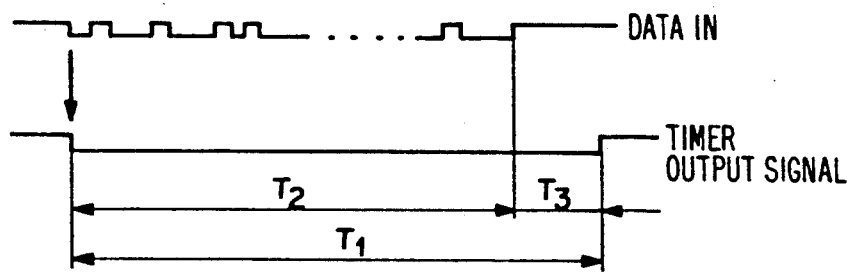
FIG. 2 is a timing diagram illustrating a signal configuration of a tariff arrangement according to the present invention.

The upper part of the diagram in FIG. 2 shows the input signal of the timer 9 while the lower part shows the output signal. The input signal alters its state when and only when a reading-out operation takes place. The timer 9 is placed with the first edge change and thus the output signal changes its state for the time $T_1$. The time $T_1$ is made up of the data transfer time $T_2$ and a safety time $T_3$. After the time $T_1$ the output of the timer 9 returns to its original state.

If the data transfer time $T_2$ is not constant, the timer 9 may be of such a design configuration that the safety time $T_3$ is restarted with each edge change in respect of the input signal.

Figure 3:
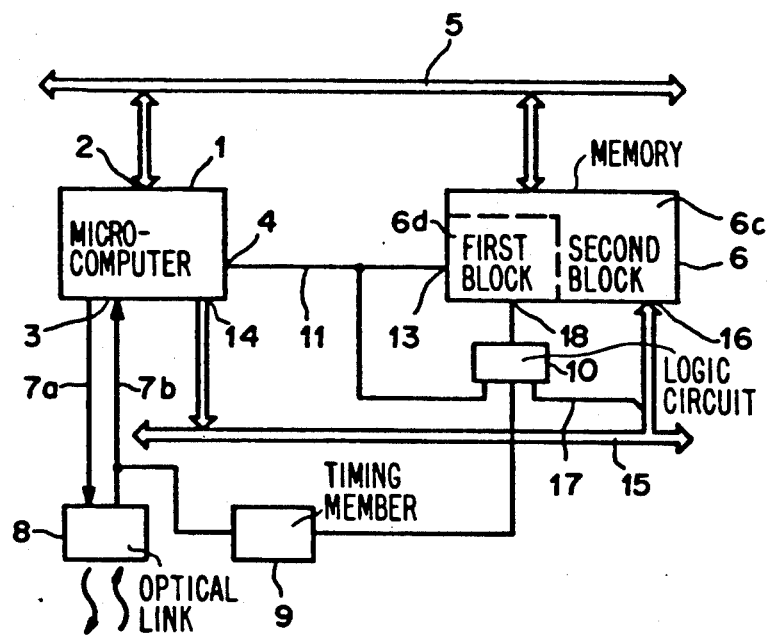
FIG. 3 shows a part of a second block circuit diagram of a tariff arrangement.

FIG. 3 shows an alternative form of the circuit illustrated in FIG. 1, with the same reference numerals referring to components which are the same or which produce the same effect, as in FIG. 1. The data memory 6 is in the form of a single memory block and is subdivided into two memory regions 6a and 6d. The memory region 6d stores those measurement values and parameters which are important for charging purposes. The memory region 6c stores parameters of subordinate significance. The output of the timer 9 is connected to a first input of the logic circuit 10. The control output 4 of the microcomputer 1 is connected by way of the control line 11 to a control line 13 of the data memory 6 and to a second input of the logic circuit 10. An address port 14 of the microcomputer 1 is connected by way of an address bus 15 to an address port 16 of the data memory 6, wherein the address lines 17 which define the memory region 6d are connected to a third input of the logic circuit 10. The output of the logic circuit 10 is connected to that address input 18 which defines the memory region 6a.

The mode of operation of the tariff arrangement shown in FIG. 3 differs from the mode of operation of the tariff arrangement shown in FIG. 1 insofar as it is not an entire memory block 6a but only a memory region 6d which is inhibited to prevent writing thereto during a data transfer operation, while however permitting a reading operation. For that purposes the logic circuit 10 decodes the signal of the control line 11, the output of the timer 9 and the address lines 17. The memory region 6a can be increased by the provision of further logic circuits 10 which link further address lines to the control line 11 and the output of the timer 9.

The circuit shown in FIG. 3 can provide an inexpensive construction in those situations where the amount of stored data has space in a data memory 6 which comprises a single component.

In the described tariff arrangement it is possible in a simple manner to check which data can be altered with a read-out device and which cannot. For that purpose it is only necessary to check the hardware, which can be done at relatively low cost. Such tariff arrangements are therefore calibratable.

What is claimed is:

1. A tariff arrangement capable of supporting a bidirectional data transfer operation comprising:
    a microcomputer,
    an interface connected to said microcomputer by way of an input data line and an output data line for the bidirectional transfer of data to or from a remote station during a reading-out operation;
    a memory connected to said microcomputer by way of a data bus, said memory having a first region and a second region, wherein during the reading-out operation only said first memory region is inhibited from being written to; and
    an inhibiting circuit connected to said microcomputer, to said first memory region and to said input data line connecting said microcomputer to said interface, said inhibiting circuit including a timer activatable by externally generated input data of the input data line during the reading-out operation for inhibiting the microcomputer from writing data to said first memory region for a time period including the period during which the reading-out operation is performed.

2. A calibratable tariff arrangement for use in an electricity meter capable of supporting a bidirectional data transfer operation comprising:
    a microcomputer;
    an interface connected to said microcomputer by way of an input data line and an output data line for the bidirectional transfer of data to or from a remote station during a reading-out operation;
    a memory connected to said microcomputer by way of a data bus, said memory having a first region for storing measurement values and charging parameters for the consumption of energy or power and a second region for storing data of subordinate significance, wherein during the reading-out operation only said first memory region is inhibited from being written to; and an inhibiting circuit connected to said microcomputer, to said first memory region and to said input data line connecting said microcomputer to said interface, said inhibiting circuit including a timer activatable by externally generated input data of the input data line during the reading-out operation for inhibiting the microcomputer from writing data to said first memory region for a time period including the period during which the reading-out operation is performed.

3. A tariff arrangement capable of supporting a bidirectional data transfer operation comprising:

a microcomputer;

an interface connected to said microcomputer by way of an input data line and an output data line for the bidirectional transfer of data during said a reading-out operation, said interface including a means for connecting to a bidirectional optical data link for the bidirectional transmission of data to and from a remote station, a memory connected to said microcomputer by way of a data bus, said memory having a first region and a second region, wherein during the reading-out operation only said first memory region is inhibited from being written to; and an inhibiting circuit connected to said microcomputer, to said first memory region and to said input data line connecting said microcomputer to said interface, said inhibiting circuit including a timer activatable by externally generated input data of the input data line during the reading-out operation for inhibiting the microcomputer from writing data to said first memory region for a time period including the period during which the reading-out operation is performed.

4. The tariff arrangement according to claim 1, 2 or 3 where the inhibiting circuit further comprises:

at least one logic circuit connected to said timer and said memory so as to inhibit the writing of data to said first region during the reading-out operation.

5. The tariff arrangement of claim 4 further comprising:

an address bus connected to said microcomputer, to said memory and to said at least one logic circuit, wherein said first memory region is defined by a portion of address lines of said address bus connected to said at least one logic circuit.

* * * * *